United States Patent [19]

Keller

[11] 4,061,413

[45] Dec. 6, 1977

[54] GASKET FOR THE HIGH-FREQUENCY-TIGHT CONNECTION OF DETACHABLE METALLIC SHIELDING ELEMENTS

[75] Inventor: Roman Keller, Erlangen, Germany

[73] Assignee: Siemens Aktiengesellschaft, Berlin and Munich, Germany

[21] Appl. No.: 619,028

[22] Filed: Oct. 2, 1975

[30] Foreign Application Priority Data

Oct. 10, 1974 Germany .................................. 2448421

[51] Int. Cl.² ................................................. H01R 11/20
[52] U.S. Cl. ................................. 339/95 R; 174/35 MS; 277/236
[58] Field of Search ................. 174/35 GC, 35 MS; 277/236, 235 A; 339/95 R

[56] References Cited

U.S. PATENT DOCUMENTS

| | | | |
|---|---|---|---|
| 2,017,007 | 10/1935 | Liedle | 277/235 B |
| 2,597,081 | 5/1952 | Goodhue | 174/35 GC |
| 2,796,457 | 6/1957 | Stinger | 174/35 GC |
| 3,502,784 | 3/1970 | Kunkel | 277/235 X |
| 3,836,700 | 9/1974 | Niemeyer | 339/95 R |
| 3,914,490 | 10/1975 | Fusiek | 277/235 R |
| 3,963,299 | 6/1976 | Thompson et al. | 339/95 R |

FOREIGN PATENT DOCUMENTS

| | | | |
|---|---|---|---|
| 2,348,529 | 4/1975 | Germany | 339/95 R |
| 2,445,898 | 4/1975 | Germany | 339/95 R |

Primary Examiner—Robert I. Smith
Attorney, Agent, or Firm—Kenyon & Kenyon, Reilly, Carr & Chapin

[57] ABSTRACT

A metallic gasket in strip form for realizing a high-frequency-tight connection of detachable metallic shielding elements and, likewise, other metallic structural elements is disclosed. The gasket is placed in the gap between the elements and brings about a good electrical contact between the elements for frequencies up into the GHz range. More particularly, in accord with the invention, the gasket is provided with a multiplicity of triangular resilient tabs which protrude on both sides of the plane of the gasket, are arranged in at least one row running approximately parallel to the long sides of the gasket, and are disposed in side by side relationship such that the projections of adjacent tabs on the plane of the gasket are rotated by 180°. Through suitable choice of the material and design of the tabs, a reliable and low-resistance contact is also achieved with the gasket in situations where the shielding and structural elements being connected are provided with corrosion protective layers.

13 Claims, 5 Drawing Figures

GASKET FOR THE HIGH-FREQUENCY-TIGHT CONNECTION OF DETACHABLE METALLIC SHIELDING ELEMENTS

BACKGROUND OF THE INVENTION

1. Field of the Invention

The invention concerns a metallic strip gasket and, in particular, a metallic strip gasket for use in connecting detachable metallic shielding elements in a high-frequency-tight manner.

2. Description of the Prior Art

When employing functional electrical modules which are arranged in housings, e.g., so-called electronics cabinets, it is often necessary to shield these functional modules against electromagnetic waves present in the external space or to confine the electromagnetic waves emanating from these functional modules to the interior of the housing, in order to prevent interference effects on sensitive electronic modules arranged in the vicinity of the housing. Thus, in the case of a process computer installed in a power station, the computer housing must act as a shield against the electromagnetic high-frequency waves present in the external space, thereby attenuating such waves to a level which is harmless for the functioning of the computer. Similarly in the case of high-frequency generators arranged in a housing, it is necessary to design the housing so that it acts as a shield to limit to a minimum the electromagnetic radiation emanating from the housing. In order to realize such shielding action, the aforesaid housings are typically formed of a metallic material so that the housings operate in the manner of a Faraday cage. Moreover, to achieve maximum shielding, the frame and the walls of the metallic housing must be designed so as to make the best possible contact. While the shielding effect attainable by a normal metallic housing is in the order of 20 dB, this effect can be increased to 90 dB by welding the joints of the housing shut on all sides. Such a welded shut housing, however, would be of limited usefulness, since it would be expensive to manufacture and would not permit ready accessibility, which is absolutely necessary in most applications.

In order to provide a metallic housing with the desired attenuation properties without having to weld the housing joints, the parts of the housing which are in contact with each other can be provided with surfaces which ensure good metallic contact. The cost of providing such surfaces, however, is about 60% of the total cost of the housing. As only a small percentage of the housings used must meet stringent shielding requirements, there appears to be little reason to standardize housing production so as to provide all the components of such housings with metallically highly conducting surfaces at the joints. On the other hand, to individually fabricate such high-attenuation housings would be extremely costly.

One inexpensive technique for connecting adjoining shielding elements of a housing in a high-frequency-tight manner is to place specially designed metallic sealing elements in the gap between the shielding elements, i.e., for instance, between the shielding plates and the frame of the housing. These sealing elements provide a contact which is as low-resistant and continuous as possible between the adjoining shielding elements when pressed against the walls of elements forming the gap.

A particular type of sealing gasket used for the above purpose is described in Swiss Pat. No. 520,460. The latter sealing gasket comprises a contact sheet which is provided with cross cuts arranged in rows. The four triangular tabs produced by a cross cut are pushed out from the plane of the sheet so as to be inclined at an angle of preferably 45° with the plane. The tabs of adjacent cross cuts, moreover, are inclined toward different sides of the gasket. Thus, as can be appreciated, the rows of cross cuts result in a multiplicity of tabs, the tabs always being arranged in groups of four each generated by a particular cross cut. Within each such group of four tabs, there are always two pairs of tabs whose projections on the plane of the gasket are rotated relative to each other by 180°.

The cut edges and, in particular, the tips of the triangular tabs of the aforesaid sealing gasket serve to dig resiliently into the adjacent surfaces of the shielding elements between which the gasket is placed. By making the cross cuts longer, an improvement in the resilient spring action of the tabs is achieved. This is particularly important if the gasket is to remain re-usable for a repeated assembly after the shielding elements are mounted. Moreover, the resilient contact of the tabs yields an attenuation characteristic which is constant over extended periods of time, which is of significant importance in the design of shielding elements.

When the aforesaid gasket is clamped between the adjacent walls of the shielding elements, the spring tabs projecting from the plane of the gasket are pushed back, at least partly, into the gasket plane. This tab movement will be referred to hereinafter as "springback." In the region of a very small area in the immediate vicinity of the intersection point of each cross cut, a contact is then formed between the four tips of the tab group and the adjacent shielding element. The next such contact between the sealing gasket and the shielding element then takes place in the vicinity of the intersection point of the next cross cut. However, since the cross cuts must exceed a certain minimum length to ensure sufficient spring action of their resultant tabs, the individual cross cuts have to be spaced relatively far apart from each other. Thus, only a relatively low contact density between the sealing gasket and the shielding elements is ever realized. As a result, considerable path resistances confront the current flowing between the shielding elements via the gasket. This, in turn, has an adverse effect on the optimum shielding effectiveness provided by the gasket in the range of low frequencies. A partial correction of such poor low frequency performance can be made by coating the surface of the gasket with high-conductivity material. While the low contact density between the gasket and the shielding elements, thus, promotes a poor shielding effectiveness at low frequencies, it likewise produces a similar result at frequencies considerably higher than 1 MHz. The aforesaid prior art gasket can so preferably be applied in the frequency range below 1 MHz. Modern applications, however, do require effective shielding over a larger bandwidth than that provided by the aforesaid prior art gasket.

It is therefore a primary object of the present invention to design a high-frequency gasket of the above type having optimized attenuation properties and, therefore, a maximum shielding effectiveness.

SUMMARY OF THE INVENTION

In accordance with the principles of the present invention the above and other objectives are realized in a gasket having individual triangular tabs arranged side by side in a row and such that the projections of adjacent tabs in the row onto the plane of the gasket are rotated by 180° with respect to each other. This geometrical arrangement of the tabs is found to result in a very high and uniform contact density over the entire gasket surface. In particular, the contact with the adjacent shielding elements is developed via the laterally projecting tab points or tips which slide when springing back from digging in during the pressing-together operation of their contact surface. Because of the extremely high contact pressures under the tab points, any protective layers of the shielding elements are penetrated or pierced and a highly conductive electrical contact with the metallic base material of the shielding elements is established.

Through the clamping of the gasket between the adjacent housing surfaces, force effects are produced by the digging-in of each tab point which affect each of the other tabs in the adjacent surfaces. Components of this force lie in the plane of the gasket and act perpendicularly to its long sides. However, with the present gasket, due to the particular arrangement of the tabs, this force effect is prevented from displacing the gasket from its intended position. Moreover, with the present gasket, the shear forces occurring at the individual tabs tend to cancel each other, thus permitting the forces to be substantially taken up by the strength of the gasket material. A displacement-free positioning of the gasket is thereby achieved during the pressing-together process, whereby it is ensured that during springback, each individual tab can transmit its maximally possible force effect on the contact surface and can dig in. This, in turn, ensures that reliable contacts will be developed.

Additionally, with the present gasket, the ratio of the tab length to the length of the base, i.e., the distance over which the tab remains connected with the gasket material, can be chosen at will. This ratio influences the springback force that can be attained with the tab. Thus it is now possible to realize a required springback by suitably selecting the tab dimensions. So, for instance, the point of a more compact tab can penetrate even thicker corrosion protection layers.

In one particular embodiment of the invention, the tips of two respective tabs of adjacent rows are situated on a common perpendicular to the base of the tabs, the bases of the tabs being approximately parallel to the long sides of the gasket. With such an arrangement of the tabs, a low path resistance for the partial flow of current from one tab of one row to the corresponding tab of an adjacent row results.

Also in this embodiment, the projections on the plane of the gasket of mutually opposite tabs of adjacent rows are rotated by 180° with respect to each other. Displacement forces that may occur between the rows during the clamping of the gasket are thereby compensated for.

Additionally, in the disclosed embodiment, adjacent pairs of tabs of a row project alternatingly from one or the other side of the gasket, and a pair of tabs of one row projecting from one side of the gasket may advantageously be opposite a pair of tabs of the adjacent row which project from the other side of the gasket. Thus, a redundant contact arrangement is achieved and the contact reliability of the gasket is thereby increased. Moreover, such an arrangement aids in realizing a constant attenuation characteristic for the gasket over an extended period of time. Thus, for example, if, due to corrosion processes, one tab of a pair projecting to one side no longer makes electrical contact, the aforesaid contact will still be provided by the remaining tab of the pair.

In this embodiment also, the tabs are designed to have a convex curvature on their surface facing the gasket over their entire length. In particular, the curvature is advantageously selected such that the tangent to the surface at the point of the tab penetrates the plane of the gasket at an angle of between 15° and 30°. Such curvature of the tabs provides a largely fatigue-free contact pressure. Moreover, the curvature and the contact angle permit the realization of an optimum force action perpendicular to the contact surface during springback, without causing the tip of the tab to get hooked into its contact surface in the first part of its sliding travel and being subsequently permanently deformed.

Reaching a very high contact pressure, the tab point rather slides on the contact surface and can penetrate even phosphatized and subsequently varnished corrosion protection coatings due to its special shape. As a result, the present gasket makes it possible to retrofit shielding housings, e.g., electronics cabinets, which were originally not intended for high-frequency use. Considerable savings can thereby be achieved.

Advantageously, the gasket of the present invention may preferably comprise a hard, spring-like metallic material. As can be appreciated, the hardness of the material helps the tab points to penetrate or scrape the protective layers of the shielding elements being connected without getting deformed and to make contact with the metallic surfaces of the elements exposed by such scraping process with high contact pressure. Also the spring-like character of the material enables a fatigue-free shielding effect to be achieved. A typical material for forming the gasket is V2A steel. The latter material is highly corrosion resistant and will permit the gasket to retain its effectiveness in a corrosion-promoting environment.

It is economical to form the tabs of the present gasket by a stamping-bending operation. The stamping causes a sharp tear edge to appear on the side of each tab which faces the contact surface of the point. This facilitates the penetration of protective layers by the tabs.

Further, the gasket of the present invention may be additionally provided with an electrically highly conductive surface coating. Such a coating further reduces the path resistance seen by currents which flow between the shielding elements via the tabs and the gasket body.

To facilitate use of the present gasket, the gasket may also be provided on one side with a foil having an adhesive on both its sides. Use of such a foil causes the gasket to be held securely in its intended position in the assembly.

BRIEF DESCRIPTION OF THE DRAWING

The above and other features and aspects of the present invention will become more apparent upon reading the following detailed description in conjunction with the accompanying drawings, in which.

DETAILED DESCRIPTION

Figure 1:
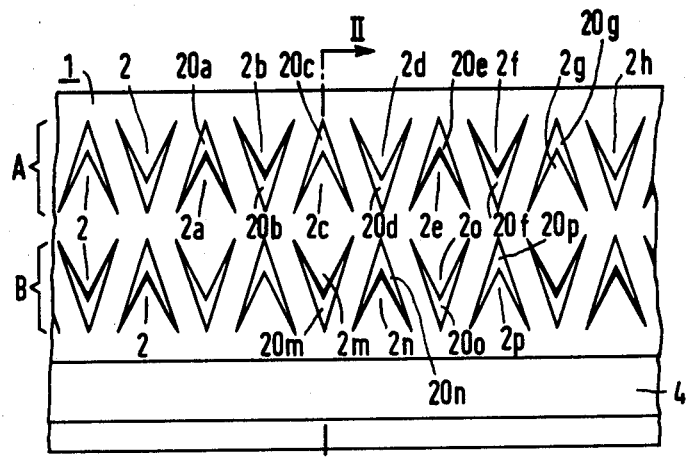
FIG. 1 shows a top view of a gasket strip in accordance with the principles of the present invention.

FIG. 1 shows the top view of a high-frequency gasket in accordance with the principles of the present invention. More particularly, the gasket comprises a metallic gasket strip 1 having a plurality of contact tabs 2 which are in the form of equilateral triangles which project upward and downward from the plane of the gasket. The tabs 2 are arranged in two rows A and B each of which is parallel to the long side of the gasket. To be able to individually identify the tabs, a lower-case letter is assigned to each of them in addition to the numeral 2. As shown, the tabs identified with the reference symbols 2a, 2b... belong to the row A, and the tabs 2m, 2n ... to the row B.

Each tab 2 may be formed by a stamping-bending operation in which the tab is first stamped from the gasket body and then bent out of the plane of the gasket so as to have a suitable curvature. The equilateral triangular cutouts or apertures remaining in the gasket plane after the stamping-bending operation correspond to the projections of the tabs in the gasket plane and are each designated with the numeral 20 and with the lower-case letter of the associated tab.

As can be seen, the individual tabs of a row are formed in such a manner that the adjacent triangular cutouts of a row, e.g., 20a, 20b of row A and 20n, 20o of row B, corresponding to projections of adjacent tabs of the row, are rotated 180° relative to each other. Due to the arrangement of the tabs in a row, however, the points of adjacent cutouts of the same row do not face each other. As can be also seen, the tabs are also formed such that the cutouts of adjacent rows opposite each other are also rotated by 180°. Thus the cutouts 20c and 20m or 20d and 20n, which are situated opposite each other in rows A and B, are such that the first pair have their respective points facing away from each other and the second pair their respective points facing toward each other. In FIG. 1, the points of these pairs of adjacent cutouts and, hence, their corresponding pairs of adjacent tabs lie on a perpendicular to the long sides of the gasket. Such a configuration ensures that the current path between two opposite tabs projecting from different sides of the gasket is short, thereby causing the path resistance between the tabs to be low.

Over the length of the gasket strip, running parallel to its long sides, a foil 4 which has an adhesive on both its sides is provided as an assembly aid. Via the foil 4, the gasket can be fastened, prior to the assembly of a housing, to one of the two housing surfaces between which it is to be located after assembly. Thus, for example, for mounting a side wall to frame parts of a housing in a high-frequency-tight manner, the gasket can be secured via the adhesive 4 to all surfaces which are to later rest against the frame parts. When the wall is then bolted to the frame a reliable, high-frequency-tight seal is formed at joints which include the gasket.

Figure 2:
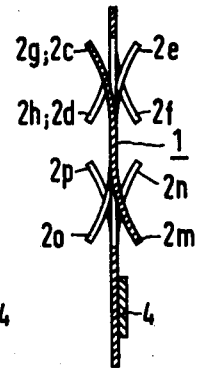
FIG. 2 is a cross sectional view through the gasket strip shown in FIG. 1 along the cross section line II—II.

FIG. 2 shows a cross sectional view of the gasket of FIG. 1 taken along the line II—II in FIG. 1. In this view, the direction of bending of the individual triangular tabs is visible. As shown, the pair of tabs 2c, 2d of row A project downward through the plane of the gasket strip, and the pairs of tabs 2a, 2b and 2e, 2f of row A adjoining to the left and right, project upward. On the other hand, the pair of tabs 2m, 2n of row B, which pair are opposite the pair of tabs 2c, 2d of row A, project upward from the plane of the gasket, and the adjacent pair of tabs 2o, 2p of row B again project downward. Thus, in general, each pair of tabs projecting from one side of the gasket have to their right and left in the same row and opposite them in the following row further pairs of tabs which project from the other side of the gasket. Moreover, by designing pairs of immediately successive tabs of the same row to project from the same side of the gasket, a redundant contact arrangement is achieved which contributes to increased contact reliability.

When the gasket is disposed between first and second shielding elements of a housing, a partial current flows from the first shielding element into the gasket, via the pair of tabs 2c, 2d of row A, for example, and then branches out therefrom, primarily via the adjacent pairs of tabs 2a, 2b and 2e, 2f of row A and 2m, 2n of row B, into the second shielding element. The current flows via the aforesaid tab pairs because they provide three parallel current paths with low resistance. Farther removed pairs of tabs carry only smaller shares of the current because of their increased path length and, therefore, resistance. As can be appreciated, an analagous type of current flow occurs for every other pair of tabs of the gasket. The tabs thus provide a reliable, low-resistance contact between the shielding parts, due to their uniform, high contact density.

In order for the gasket of FIG. 1 to provide the abovedescribed contact between the first and second shielding parts, the individual tabs must make metallic contact with such parts. Since the shielding parts, as a general rule, are protected against corrosion by a protective coating, i.e., they are phosphatized and varnished, the tabs 2 of the gasket 1 are designed, in accord with the invention, so as to pierce the aforesaid protective coating. An electrically conducting connection to the metallic base material thus results.

Figure 3:
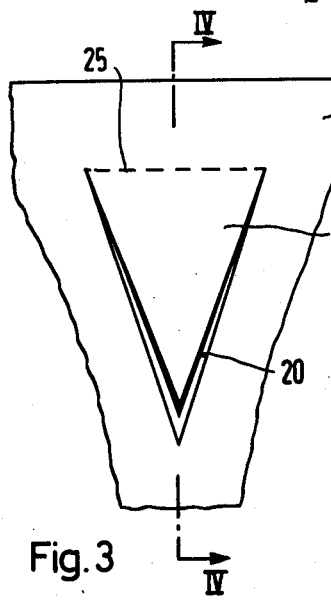
FIG. 3 shows a magnified view of a triangular tab of the gasket of FIG. 1.

More specifically, the configuration of the tabs of the gasket 1 can be seen from FIG. 3, which shows a top view of a portion of the gasket which includes a single triangular tab 2. As discussed above, the tab 2 is formed from the metallic base of the gasket by a stamping operation and, thereafter, is bent upward out of the plane of the gasket. If care is taken, the stamping operation and the bending operation may be carried out using the same tool. In forming the tab 2, a cutout 20 is formed in the gasket material in the shape of an equilateral triangle.

Figure 4:
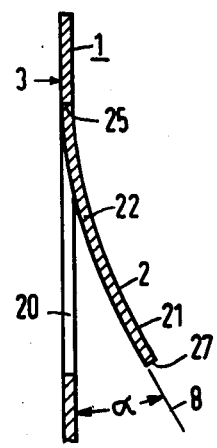
FIG. 4 is a cross sectional view through the tab of FIG. 3 along the cross section line IV—IV in FIG. 3.

FIG. 4 shows a cross section of the tab configuration of FIG. 3 taken along the cross section line IV—IV in the latter figure. As can be seen, the bending out of tab 2 is such that the tab is curved away from the gasket over its entire length and such that the tangent line 8 at the point of the tab penetrates the plane of the gasket 1 at an angle $\alpha$ which is between 15° and 30°. This curvature provides sufficient spring travel for the tab so that the inability to realize completely identical curvatures for all such tabs can easily be compensated for. On the other hand, the tab curvature causes considerable forces to be exerted perpendicularly to the tab contact surface during the time when the tab is being pressed into a shielding element of a housing. It is important to note in this connection that when pressed in, the tab point slides on the element surface under high pressure, scraping and making a groove, and thereby digging into the metallic base material. This digging in is promoted by the fact that an extremely sharp-edged tear line is produced by the stamping process on the side 21 of the tab 2 facing away from the plane of the gasket. In order to achieve a sufficiently high, elastic contact pressure, the tab must not be made too narrow at its base 25, i.e., at the point where it remains connected with the base metal of the gasket 1.

As can be appreciated from the above, when the gasket 1 is being clamped between two shielding elements, force components perpendicular to the long sides of the gasket are produced during springback of the tab points which occurs when they claw into the contact surface. Such springback can lead to a dislocation of the gasket from its originally intended position. With the tabs 2 arranged on gasket 1 as in FIG. 1, however, force compensation occurs, so that no displacement of the gasket results. In particular, adjacent tabs of the same row and opposite tabs of different rows cooperate to provide compensating forces, so that upon clamping of the gasket, no resultant displacement force is produced.

It should be also noted, with respect to the gasket of FIG. 1, that the path resistance for the current flow in the gasket body can be kept low, by coating the surface of the gasket with an electrically, very highly conductive metal, e.g., gold.

Figure 5:
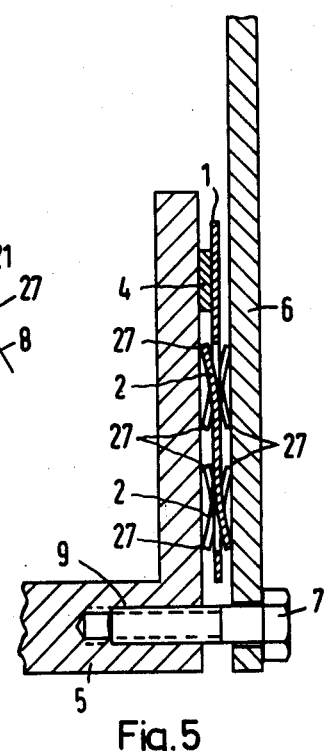
FIG. 5 is a cross sectional view through a housing employing the gasket of FIG. 1.

FIG. 5 shows in horizontal cross section the use of the gasket of FIG. 1 to provide a high-frequency-tight connection between a frame portion 5 and a shielding plate 6 of a housing. The frame 5 may be, for example, a vertically disposed corner section of an electronics cabinet. In FIG. 5, the gasket strip 1 runs perpendicularly to the plane of the drawing along the frame portion and is fastened to the frame by the adhesive strip 4. To better illustrate how the gasket functions, FIG. 5 depicts the situation in which the fastening screw 7 of the shielding plate 6 is not turned fully into the threaded hole 9 of the frame. As can be seen, the sharp-edged points 27 of the tabs 2 which rest on the surfaces of the elements 5 and 6 are moved horizontally as they are pressed closer to the plane of the gasket under the influence of the contact force generated by the screws 7 against the spring force of the tabs. This horizontal movement of the points 27 on the contact surfaces connected therewith causes a piercing of the corrosion protection layers coating the surfaces and, thus, a digging into the metallic bodies underneath such surfaces.

A particularly advantageous material which has the degree of hardness, on the one hand, and the degree of spring action, on the other hand, required of the tabs 2 is V2A steel. This material has the additional advantage that it is extremely corrosion-resistant so that it can be used in housings which are to be subjected to a corrosion-promoting atmosphere.

In summary, it can be stated that the present high-frequency gasket provides a reliable, wideband seal against high-frequency waves which is both inexpensive and easy to install.

What is claimed is:

1. A gasket for use in realizing a high-frequency-tight connection between first and second detachable metallic shielding elements, said gasket having first and second exterior surfaces adapted to face said first and second elements, respectively, when said gasket is placed in the gap between said elements, said gasket comprising:
   a strip of metallic material;
   a multiplicity of triangular spring tabs arranged in at least one row approximately parallel to the long sides of said strip and projecting outwardly from said exterior surfaces, said tabs being disposed in said row individually in side by side relationship and such that the projections of adjacent tabs onto the plane of said strip are rotated by 180° relative to one another.

2. A gasket in accordance with claim 1 in which there are at least two such rows of said tabs, and in which the points of the triangular projections onto the plane of said strip of oppositely disposed tabs of adjacent rows lie on a common perpendicular to the bases of said projections.

3. A gasket in accordance with claim 2 in which said tabs are arranged so that their bases are approximately parallel to the long sides of said strip.

4. A gasket in accordance with claim 2 in which the projections in the plane of the strip of oppositely disposed tabs of adjacent rows are rotated 180° relative to each other.

5. A gasket in accordance with claim 1 in which said tabs of said row are arranged such that adjacent pairs of tabs project alternatingly from one or the other side of said strip.

6. A gasket in accordance with claim 5 in which there are two such rows of tabs, and in which said tabs are arranged such that each pair of tabs of said first row which project from one side of said strip are opposite a pair of tabs of said second row which project from the other side of said strip.

7. A gasket in accordance with claim 1 in which the surface of each of said tabs facing said strip has a convex curvature over its entire length.

8. A gasket in accordance with claim 1 in which each of said tabs is configured so that the tangent at the point of the tab penetrates the plane of said strip at an angle between 15° and 30°.

9. A gasket in accordance with claim 1 in which said strip and said tabs comprise a hard, spring-like metallic material.

10. A gasket in accordance with claim 9 in which said metallic material is V2A steel.

11. A gasket in accordance with claim 1 in which each of said tabs comprises a portion of said strip which is stamped therefrom and bent out from the plane thereof by a stamping and bending operation.

12. A gasket in accordance with claim 1 in which said strip and said tabs are coated with an electrically highly conductive surface coating.

13. A gasket in accordance with claim 1 further including a foil strip having adhesive on both sides which is secured on one side of said metallic strip.

* * * * *